United States Patent [19]
Rolandi

[11] Patent Number: 6,101,121
[45] Date of Patent: Aug. 8, 2000

[54] MULTI-LEVEL MEMORY CIRCUIT WITH REGULATED READING VOLTAGE

[75] Inventor: Paolo Rolandi, Alessandria, Italy

[73] Assignee: STMicroelectronics S.r.l., Agrate Brianza, Italy

[21] Appl. No.: 09/202,657

[22] PCT Filed: Oct. 30, 1996

[86] PCT No.: PCT/IT96/00198

§ 371 Date: May 5, 1999

§ 102(e) Date: May 5, 1999

[87] PCT Pub. No.: WO97/49087

PCT Pub. Date: Dec. 24, 1997

[30] Foreign Application Priority Data

Jun. 20, 1996 [EP] European Pat. Off. .............. 96830355

[51] Int. Cl.[7] .................................................. G11C 11/34
[52] U.S. Cl. ............................... 365/185.03; 365/185.18; 365/185.23
[58] Field of Search ........................ 365/185.03, 185.18, 365/185.23, 185.01

[56] References Cited

U.S. PATENT DOCUMENTS

5,218,569 6/1993 Banks .................................. 365/189.01
5,511,026 4/1996 Cleveland et al. ................. 365/189.09

FOREIGN PATENT DOCUMENTS

0 656 629 A2 11/1994 European Pat. Off. .
0 715 312 A1 11/1994 European Pat. Off. .
WO 95/07535 3/1995 WIPO .

*Primary Examiner*—David Nelms
*Assistant Examiner*—Hoai V. Ho
*Attorney, Agent, or Firm*—Theodore E. Galanthay; Allen, Dyer, Doppelt, Milbrath & Gilchrist, P.A.

[57] ABSTRACT

A multi-level memory circuit for binary information includes a plurality of memory cells each adapted to store more than one item of binary information, and each memory cell includes at least one floating gate MOS transistor. The information stored therein corresponds to the level of the cell threshold voltage. A read voltage generating circuit is adapted to an input supply voltage and provides a read voltage to the memory cells. The read voltage generating circuit includes a voltage boosting circuit providing the read voltage greater than the input supply voltage.

17 Claims, 4 Drawing Sheets

MULTI-LEVEL MEMORY CIRCUIT WITH REGULATED READING VOLTAGE

FIELD OF THE INVENTION

This invention relates to a multi-level type of memory circuit for binary information.

Memories of this type are usually termed "non-volatile" because of their capability to retain stored information over very long time periods, even in the absence of a power supply, and include the EPROM, EEPROM, and FLASH EEPROM families.

BACKGROUND OF THE INVENTION

Known from U.S. Pat. Nos. 5,218,569 and 5,394,362 are multi-level non-volatile memories of this type. The construction of a FLASH EEPROM multi-level memory is also described in an article TA 7.7, "A Multilevel Cell 32 Mb Flash Memory", ISSCC95 Conference, Feb. 16, 1995.

These publications also tackle the reading problem, that is the difficulty of discriminating among four different, fairly tightly packed levels for the cell threshold voltages.

From U.S. Pat. No. 4,964,079 a particular read circuit for multi-level non-volatile memories of this type is known.

All these read circuits and methods provide for the application, between the gate and source terminals of a cell being read, of a read voltage from a row decoding circuit which is powered by a supply circuit. The current flowing into the channel of the MOS transistor, or the voltage at the drain terminal, for example, is then measured and compared to currents or voltages having reference values.

This is also the case with two-level memories. Known from U.S. Pat. No. 5,291,446 is a power supply circuit for a row decoding circuit which suits the effectuation of read, write, and erase operations on two-level non-volatile memories. This power supply circuit comprises a read voltage generating section effective on request to output a voltage corresponding to the supply voltage, a write voltage generating section effective on request to output a boosted positive voltage with respect to the supply voltage, and an erase voltage generating section effective on request to output a highly negative voltage with respect to ground.

The present invention sets out from the idea of having the different threshold voltage levels for multi-level non-volatile memories sufficiently spaced apart to make the read circuit significantly less critical.

The situation is complicated, however, by the distribution of the various cell characteristics after write and/or erase operations, accurate as these may be.

SUMMARY OF THE INVENTION

The idea underlying this invention is one of having the gate-source voltage VGS thoroughly under careful control, so that current and/or voltage readings can be performed with the utmost accuracy.

This requires the availability of a read voltage generator which is unrelated to the supply voltage, can overtake it, and is preferably regulated.

BRIEF DESCRIPTION OF THE DRAWINGS

The invention can be better appreciated from the following description, to be read in conjunction with the accompanying drawings, in which.

DETAILED DESCRIPTION OF THE PREFERRED EMBODIMENTS

Figure 1:
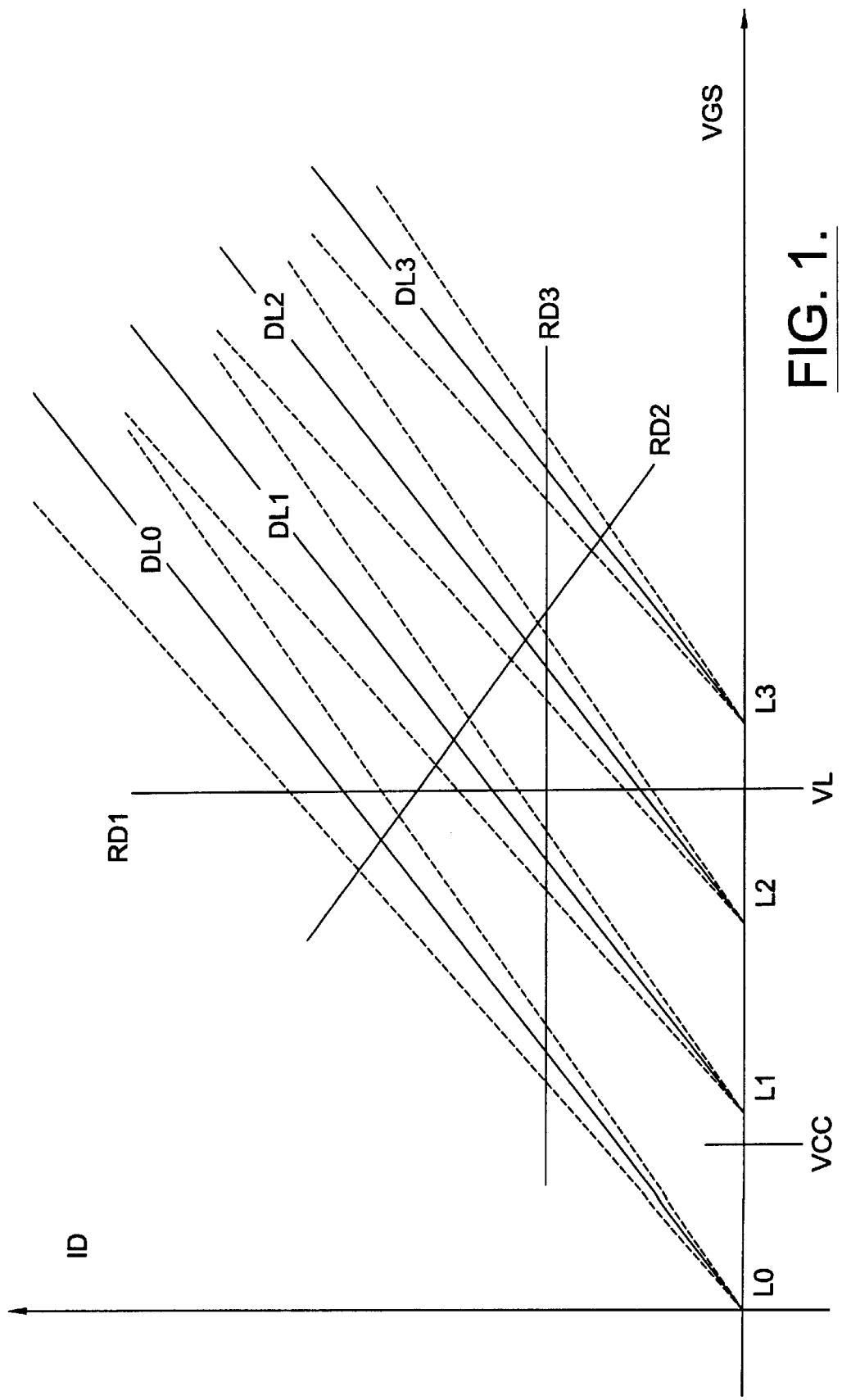
FIG. 1 illustrates cell characteristics vs. associated levels and gain variations.

FIG. 1 depicts an ideal situation in which the cells associated with one level have exactly the same threshold voltage. In the instance of FIG. 1, there are four discrete levels DL0, DL1, DL2, DL3 provided which are associated with four discrete cell threshold voltage values L0, L1, L2, L3. This can only be obtained by adopting extremely complicated write and erase methods, and such a situation can at best be approached in actual practice.

Irrespective of the method used, the characteristics of the various cells associated with one level are bound to be different because the manufacture of integrated circuits cannot yield perfectly identical cells. Thus, such characteristics will show a distribution, as indicated by dash lines and referenced DL0, DL1, DL2, DL3 in FIG. 1, centered about an average characteristic indicated by a full line in FIG. 1. The parameter that differentiates cells in the same distribution is the so-called "gain" of a cell.

A read operation is to find the intersection of the characteristic of a cell to be read from with a read line; FIG. 1 shows three viable read lines RD1, RD2, RD3.

It can be appreciated from FIG. 1 that for an "easy" reading, i.e. with but a slight chance of confusing between levels, the latter should be spaced well apart. FIG. 1 illustrates a typical situation where the supply voltage VCC is low, e.g. 2.2 volts. It should be understood that it is not necessary for the level spacings to be uniform as shown in FIG. 1; on the contrary, the spacings can be optimized as most appropriate for reading.

All three of the read lines RD1, RD2, RD3 require that a cell be supplied a higher voltage VGS than the supply voltage VCC. In addition, the lines RD2 and RD3 require that the value of the voltage VGS be controlled according to the current ID flowing between the drain and source terminals of the cell being read from; such lines should be positioned so that cells associated with different levels can be readily differentiated from one another.

An easily implemented read line is the line RD1, which corresponds to the normal read mode previously described. The read voltage VL should be at least higher than the level L2—the last-but-one from the bottom—for otherwise the levels L2 and L3 cannot be differentiated according to the current ID. Having a higher voltage VL than the level L3 would be of little use, and could entail two disadvantages: on the one side, it becomes necessary to discriminate among four different values of the current ID, and on the other, in proceeding toward the top, there would be a risk of confusing the levels, in particular L0 and L1, due to their diverging characteristics.

Figure 3:
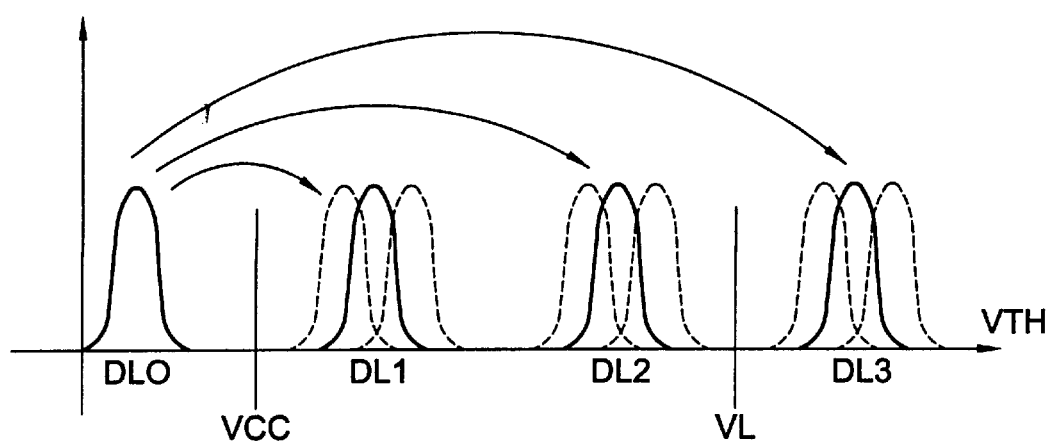
FIG. 3 shows distributions of cell threshold voltages vs. associated levels.

FIG. 3 illustrates the effect of the write method on the threshold voltage distributions. Seeing that if a set of cells having a given distribution are subjected to precisely the same electrical "treatment", the distribution remains near-constant and shifts in voltage, an uncertainty about the extent of the shift will depend substantially on the write method. By using a fairly simple method, the effect from an initial level L0 can be that shown in FIG. 3 for different end levels L1, L2, L3.

The divergence problem in connection with a simple read method—read line RD1—and a simple write method, restricts the number of the levels, and the more so where CMOS technologies are used in which the usable voltages tend to be limited, e.g. in the range of 12 to 15 volts.

The multi-level memory circuit of this invention comprises:

a) a plurality of memory cells, each adapted to store more than one item of binary information and comprised of at least one floating gate MOS transistor, the information stored in each cell corresponding to the level of the cell threshold voltage; and b) a read voltage generating circuit for the cell plurality, adapted to be input a supply voltage.

Such a memory circuit would include a voltage boosting circuit adapted to generate a read voltage having a higher value than the value of the supply voltage.

In this way, the various levels are free to be associated with threshold voltage values without undergoing restrictions from the value of the read voltage, and this independently of the read line selected.

Since voltage boosting involves circuits which are the more complex the larger the boost applied, it would be advantageous if the value of the read voltage can be an intermediate one between the highest level and the next lower level of the threshold voltage.

When simple read/write methods are chosen, the ideal number of discrete levels is four.

To improve the memory circuit performance, especially as the level spacing decreases, the voltage boosting circuit is to generate a read voltage with a regulated value. This can be accomplished using a linear type of voltage regulator having a reference circuit to provide a stable reference voltage.

The present circuit is applicable in particular to either EPROMs or OTP (One Time Programmable) memories (OTP memories being basically non-erasable EPROMs in that they lack a UV radiation transparent window), because the uncertainty about the distribution shift would be there only once. In fact, reprogramming is impossible, and erasing either impossible or effected by a separate physical process, and since programming can be performed theoretically with great accuracy because off-line, in the last-mentioned case the number of the levels can be raised to sixteen, at an error rate which is still acceptable.

The inventive memory circuit just described can be included in a semiconductor integrated electronic storage device or a generic semiconductor integrated electronic device in combination with at least one logic circuit connected to the memory circuit for reading and/or writing information.

An EPROM semiconductor integrated electronic storage device will now be described by way of example with the aid of FIGS. 2, 4 and 5.

Figure 2:
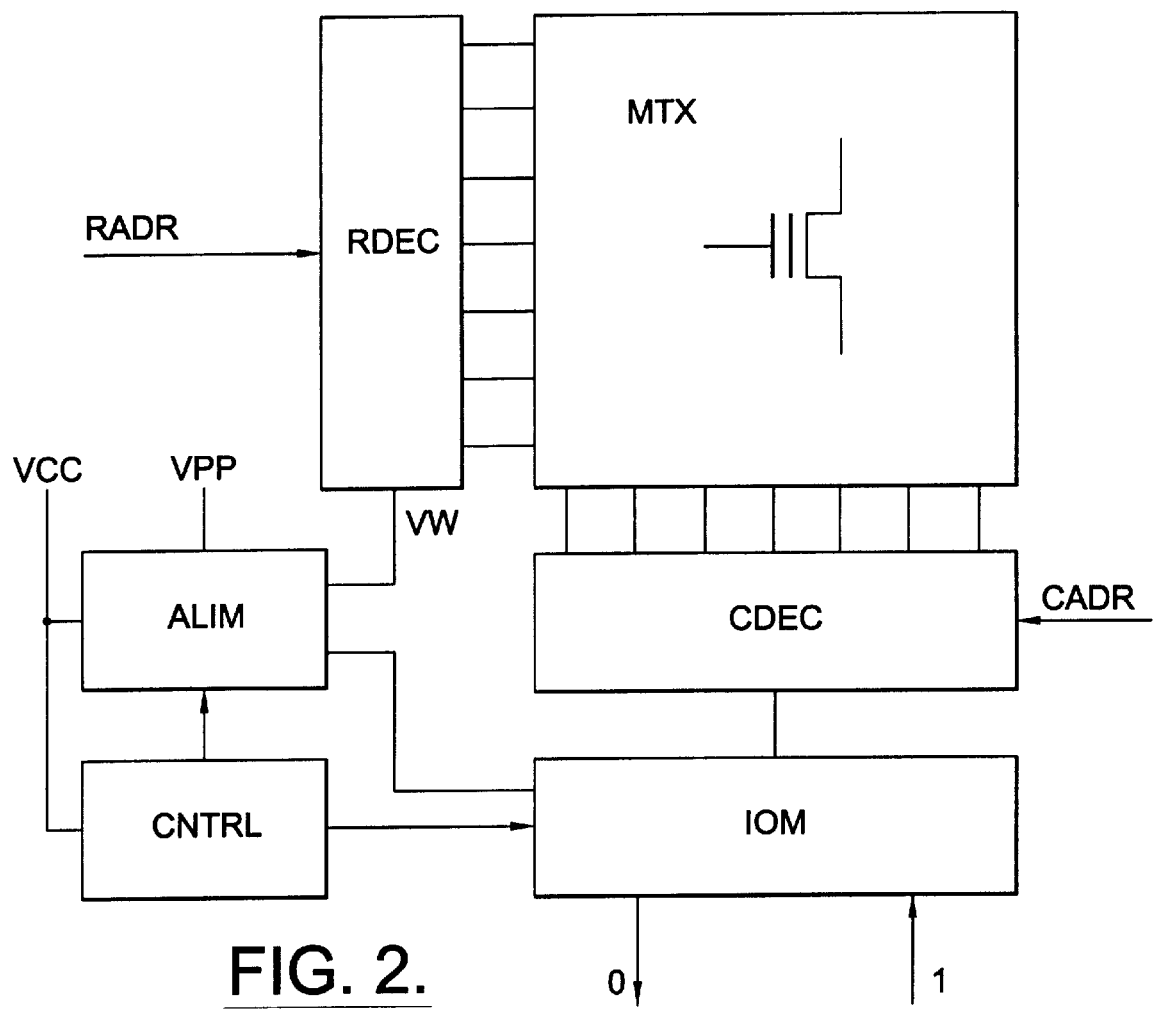
FIG. 2 illustrates the architectures of a conventional electronic storage device and one according to the invention.

The architecture of FIG. 2 comprises a matrix MTX of memory cells organized into rows and columns. Connected thereto are a row decoder RDEC and a column decoder CDEC, which are input row RADR and column CADR addresses, respectively. The decoder CDEC is connected to an input/output managing circuit IOM which performs physically the read/write operations from/into the cells according to input signals I thereto and output signals O therefrom.

The circuits in the architecture of FIG. 2 need to be powered, which is accomplished by means of a power supply circuit ALIM receiving an external supply voltage VCC and external program voltage VPP. In general, EPROMs are only supplied the voltage VPP during the off-line programming phase. In particular, the circuit ALIM supplies the decoder RDEC with a voltage VW for the word line which may be regarded as the read voltage during read operations, and the write voltage during write operations.

The storage devices further require, and do include, a control circuit CNTRL which is supplied the voltage VCC to control the operation of the various internal circuits according to input control signals, not shown in FIG. 2.

Figure 4:
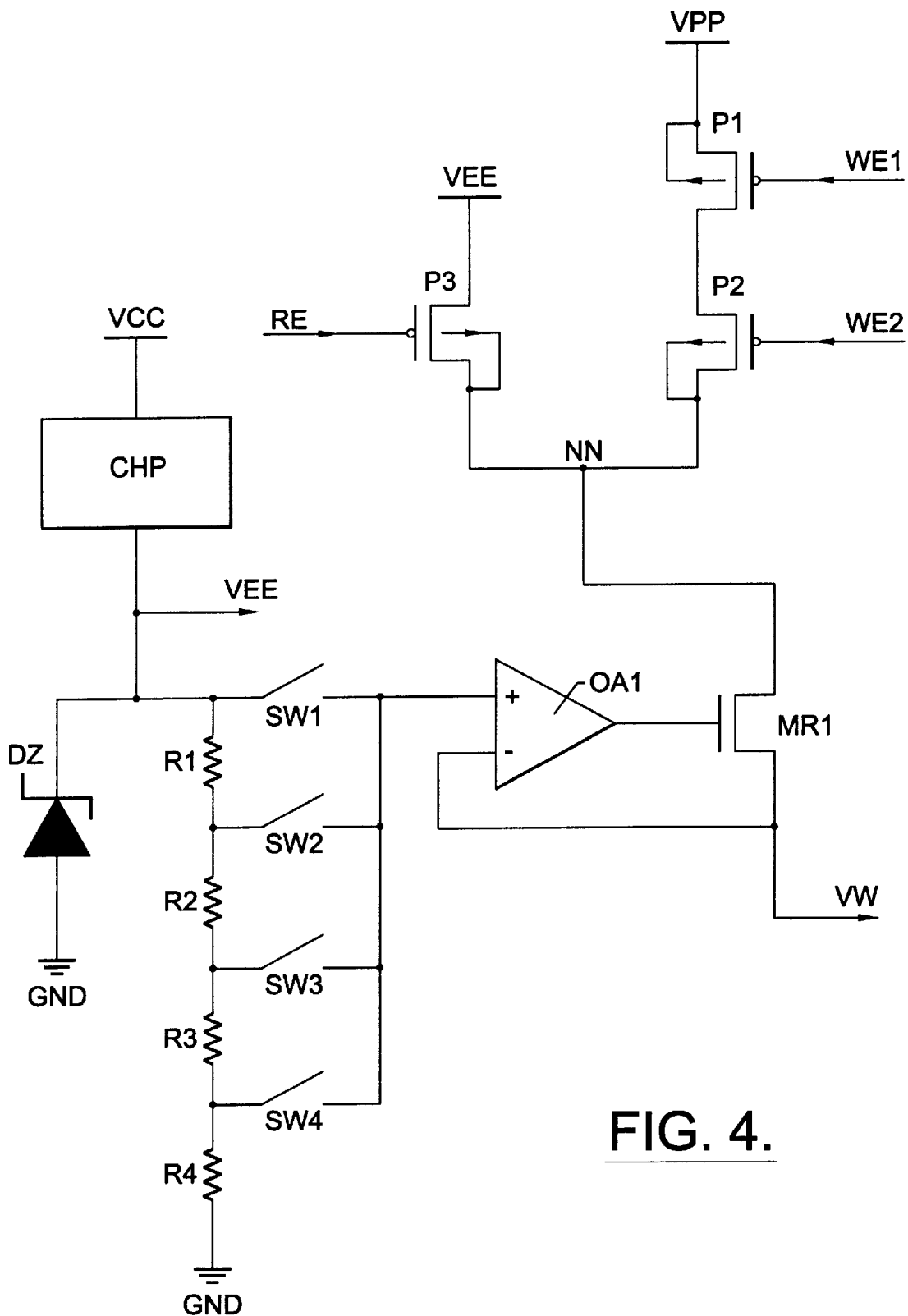
FIGS. 4 and 5 show first and second circuit diagrams for part of a generating circuit according to the invention.
Figure 5:
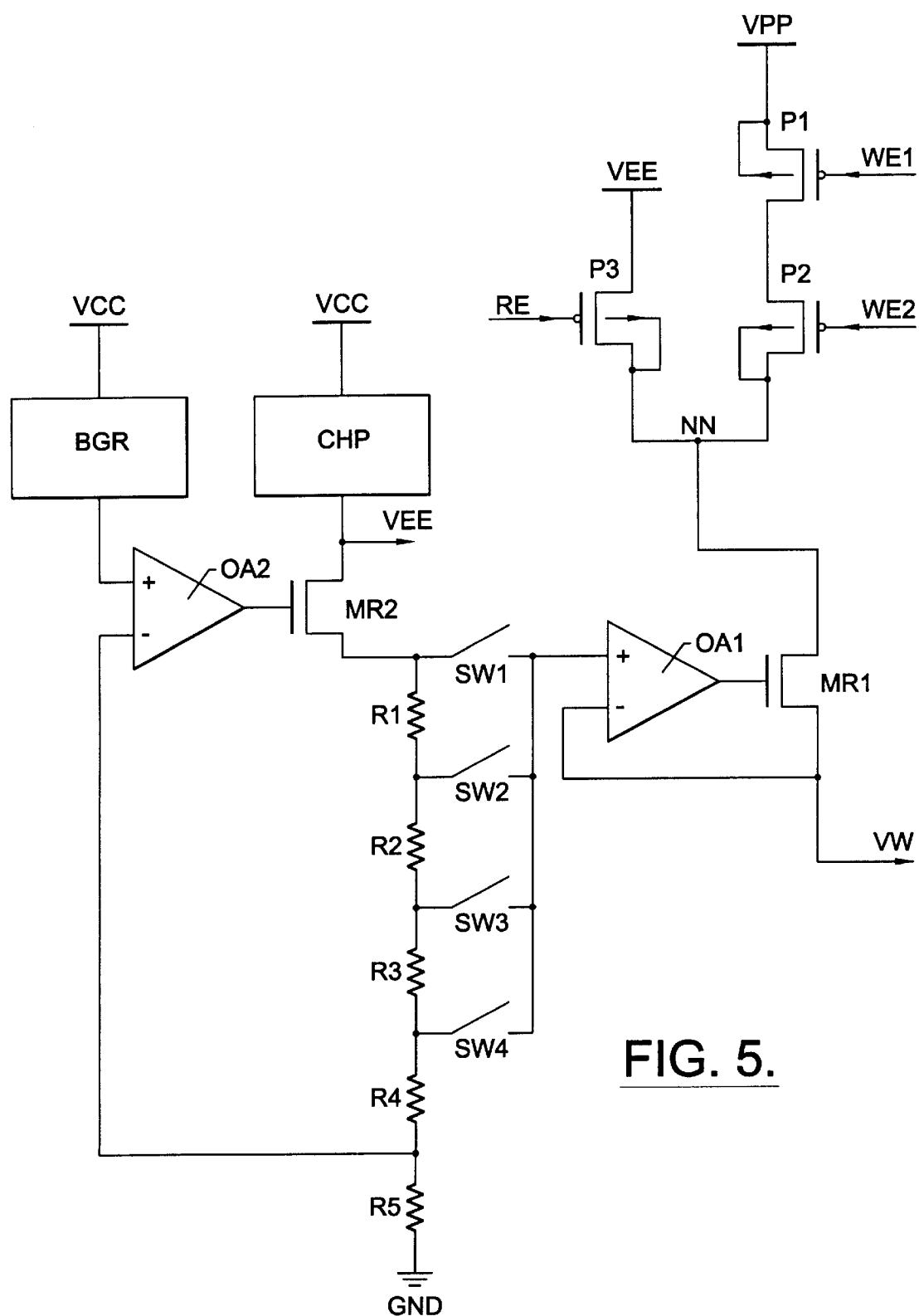

The circuits shown in FIGS. 4 and 5 illustrate two alternatives for a portion of the circuit ALIM which is utilized to generate the read or write voltage VW, as the case may be.

The circuit of FIG. 4 comprises three P-channel MOS transistors P1, P2, P3 serving as controlled switches. The first two, P1 and P2, have their main conduction paths connected in series between a node to be connected to a program voltage reference VPP and an internal node NN. The transistor P3 has its main conduction path connected between a node to be connected to a boosted voltage reference VEE and the internal node NN. The transistors P1 and P2 are input, to their control terminals, two write enable signals WE1 and WE2, respectively, which are synchronous with each other. The transistor P3 is input, to its control terminal, a read enable signal RE. The two transistors in series in the write leg serve to prevent any spurious current flows between the references VEE and VPP.

The circuit of FIG. 4 further includes a conventional charge pump circuit CHP being input a supply voltage VCC and outputting the boosted voltage VEE. In general, such charge pump circuits include regulating arrangements to prevent the output voltage from overtaking predetermined limits. The output of the circuit CHP is connected to a first terminal of a zener diode DZ acting as a reference voltage generating circuit; the other terminal of the diode DZ is connected to ground, GND.

The output of the circuit CHP is connected to a first end terminal of a voltage divider comprised of four resistors R1, R2, R3, R4 connected serially together, the second end terminal being connected to ground at GND.

The center taps and first end terminal of the divider are connected to the non-inverting input of an operational amplifier OA1 via four controlled switches SW1, SW2, SW3, SW4, respectively. In one embodiment, the voltage at the first end terminal, and therefore, the zener voltage, is 12 volts, and the voltages at the center taps are 10, 8 and 7 volts, respectively. The 7-volt voltage is used for reading, and the other three for programming three different levels of the threshold voltage. The fourth level is provided by the erasing through exposure to UV radiation.

The amplifier OA1 and a transistor MR1 form the essentials of a voltage regulator of the linear type. The gate terminal of the regulation transistor MR1 is controlled by the output from the amplifier OA1. The source terminal of the transistor MR1 is connected to the inverting input of the amplifier OA1, and its drain terminal is connected to the node NN. The output of the linear regulator is the source terminal of the transistor MR1.

The circuit of FIG. 5 is basically identical with the circuit of FIG. 4, except that its reference circuit is different and comprises a conventional band-gap circuit BGR being supplied the voltage VCC. This circuit can output a truly stable voltage, typically of 2 volts.

The output of the circuit BGR is connected to the non-inverting input of another operational amplifier OA2. The output of the amplifier OA2 is connected to the gate terminal of another regulation transistor MR2. The main conduction path of the transistor MR2 is interposed between the output of the circuit CHP and the divider input, i.e. the first end terminal thereof. The divider of FIG. 5 has four center taps, because one of these, presenting a corresponding voltage to that from the circuit BGR, is to be connected to the inverting input of the amplifier OA2.

The operation of the circuits shown in FIGS. 4 and 5 is substantially the same.

The transistors P1, P2, P3 function to select the supply source from VPP or VEE, while preventing spurious current flows from occurring between the two sources.

The transistor MR1, in cooperation with the amplifier OA1, sets the voltage VW to the voltage value present at the amplifier non-inverting terminal, i.e. the voltage value of the tap selected by means of the switches SW1, ..., SW4.

The voltage at the divider input corresponds to the voltage from the circuit CHP as stabilized by a suitable stabilizing circuit comprised of the zener diode DZ of FIG. 4, the band-gap circuit BGR jointly with the amplifier OA2, and the transistor MR2 of FIG. 5.

What is claimed is:

1. A multi-level memory circuit comprising:
    a plurality of memory cells, each for storing more than one item of binary information and comprising at least one floating gate MOS transistor, the information stored in each cell corresponding to a threshold voltage level thereof; and
    a read voltage generating circuit for said plurality of memory cells and having an input connected to a supply voltage, said read voltage generating circuit including a voltage boosting circuit for generating a read voltage greater than the supply voltage, and a voltage divider for providing discrete spaced apart read voltage values from the read voltage corresponding to a number of discrete spaced apart threshold voltage levels, wherein said voltage boosting circuit further comprising a linear voltage regulating circuit including a reference circuit for generating a stable reference voltage.

2. A multi-level memory circuit according to claim 1, wherein the read voltage lies intermediate a highest threshold voltage level and a next lower threshold voltage level.

3. A multi-level memory circuit according to claim 1, wherein the number of threshold voltage levels is four.

4. A multi-level memory circuit according to claim 1, wherein said voltage boosting circuit generates the read voltage with a regulated value.

5. A multi-level memory circuit according to claim 1, wherein each of said plurality of memory cells is an EPROM cell.

6. A multi-level memory circuit according to claim 1, wherein each of said plurality of memory cells is an OTP cell.

7. A multi-level memory circuit comprising:
    a plurality of memory cells, each comprising at least one floating gate MOS transistor and storing information based on four discrete spaced apart threshold voltage levels; and
    a read voltage generating circuit for said plurality of memory cells and having an input connected to a supply voltage, said read voltage generating circuit including a voltage boosting circuit for generating a read voltage intermediate a highest threshold voltage level and a next lower threshold voltage level, and a voltage divider for providing four discrete spaced apart read voltage values from the read voltage corresponding to the four discrete spaced apart threshold voltage levels, wherein said voltage boosting circuit further comprising a linear voltage regulating circuit including a reference circuit for generating a stable reference voltage.

8. A multi-level memory circuit according to claim 7, wherein said voltage boosting circuit generates the read voltage with a regulated value.

9. A multi-level memory circuit according to claim 7, wherein each of said plurality of memory cells is an EPROM cell.

10. A multi-level memory circuit according to claim 7, wherein each of said plurality of memory cells is an OTP cell.

11. A semiconductor integrated electronic storage device comprising:
    at least one memory circuit comprising
        a plurality of memory cells, each for storing more than one item of binary information and comprising at least one floating gate MOS transistor, the information stored in each cell corresponding to a threshold voltage level thereof, and
        a read voltage generating circuit for said plurality of memory cells and having an input connected to a supply voltage, said read voltage generating circuit including a voltage boosting circuit for generating a read greater than the supply voltage, and a voltage divider for providing discrete spaced apart read voltage values from the read voltage corresponding to a number of discrete spaced apart threshold voltage levels, wherein said voltage boosting circuit further comprising a linear voltage regulating circuit including a reference circuit for generating a stable reference voltage.

12. A semiconductor integrated electronic device according to claim 11, further comprising at least one logic circuit connected to the at least one memory circuit for one of reading and writing information.

13. A semiconductor integrated electronic device according to claim 11, wherein the read voltage lies intermediate a highest threshold voltage level and a next lower threshold voltage level.

14. A semiconductor integrated electronic device according to claim 11, wherein the number of threshold voltage levels is four.

15. A semiconductor integrated electronic device according to claim 11, wherein said voltage boosting circuit generates the read voltage with a regulated value.

16. A semiconductor integrated electronic device according to claim 11, wherein each of said plurality of memory cells is an EPROM cell.

17. A semiconductor integrated electronic device according to claim 11, wherein each of said plurality of memory cells is an OTP cell.

* * * * *